(12) United States Patent
Fu

(10) Patent No.: US 12,415,634 B2
(45) Date of Patent: Sep. 16, 2025

(54) UNMANNED AERIAL VEHICLE BASE STATION AND UNMANNED AERIAL VEHICLE SYSTEM

(71) Applicant: AUTEL ROBOTICS CO., LTD., Shenzhen (CN)

(72) Inventor: Dianlin Fu, Guangdong (CN)

(73) Assignee: AUTEL ROBOTICS CO., LTD., Guangdong (CN)

( * ) Notice: Subject to any disclaimer, the term of this patent is extended or adjusted under 35 U.S.C. 154(b) by 0 days.

(21) Appl. No.: 18/431,204

(22) Filed: Feb. 2, 2024

(65) Prior Publication Data

US 2024/0262545 A1  Aug. 8, 2024

(30) Foreign Application Priority Data

Feb. 3, 2023 (CN) .......................... 202310106635.9

(51) Int. Cl.
*B64U 70/90* (2023.01)
*B64F 1/35* (2024.01)
(Continued)

(52) U.S. Cl.
CPC ................ *B64U 70/90* (2023.01); *B64F 1/35* (2024.01); *H02J 7/0042* (2013.01); *H02J 7/34* (2013.01); *H05K 7/20909* (2013.01)

(58) Field of Classification Search
CPC ............ B60H 1/00257; B60H 1/00278; B60H 1/00478; B60L 53/00; B64F 1/35; B64F 1/352; B64U 70/90; B64U 70/92; B64U 70/93; B64U 70/95; B64U 70/97; B64U 70/99; B64U 80/10; H01M 10/443; H01M 10/613; H01M 10/617; H01M 10/625; H01M 10/653; H01M 10/6551; H01M 10/6556; H02J 7/0042; H02J 7/0044; H02J 7/0045; H02J 7/34; H02J 7/342; H02J 7/345; H02J 7/35; H02J 7/20; H02J 7/20136; H02J 7/20145; H02J 7/20172;
(Continued)

(56) References Cited

U.S. PATENT DOCUMENTS 10,526,094 B2 * 1/2020 Cheng .................... B64U 80/70
11,634,221 B2 * 4/2023 Chen ....................... F24H 15/25
244/110 E
(Continued)

FOREIGN PATENT DOCUMENTS

CN   108513685 A  * 9/2018
CN   215753079 U  * 2/2022

*Primary Examiner* — Joshua E Rodden

(57) ABSTRACT

The embodiments of the present disclosure involve the technical field of unmanned aerial vehicles, and disclose an unmanned aerial vehicle base station and an unmanned aerial vehicle system. The unmanned aerial vehicle base station includes a bracket, a tarmac, a charging component, and a temperature adjusting component. The bracket is provided with an accommodating cavity, the tarmac separates the accommodating cavity into an upper compartment chamber and a lower compartment chamber, the temperature adjusting component includes a semiconductor module, a first ventilation assembly, a second ventilation assembly, and a third ventilation assembly, and the semiconductor module is partially provided on the first ventilation assembly and partially provided on the second ventilation assembly.

19 Claims, 3 Drawing Sheets

(51) Int. Cl.
*H02J 7/00* (2006.01)
*H02J 7/34* (2006.01)
*H05K 7/20* (2006.01)

(58) Field of Classification Search
CPC ...... H02J 7/2089; H02J 7/209; H02J 7/20909; H02J 7/20918; H02J 7/20927; H02J 7/20936; H02J 7/20945; Y02T 10/70
USPC ..................................................... 244/114 R
See application file for complete search history.

(56) References Cited

U.S. PATENT DOCUMENTS

| | | | | |
|---|---|---|---|---|
| 11,912,408 | B2* | 2/2024 | Falk-Petersen | B64U 80/10 |
| 12,030,403 | B2* | 7/2024 | Henry | B64F 1/12 |
| 12,162,635 | B2* | 12/2024 | Lowe | H01M 10/653 |
| 2018/0327091 | A1* | 11/2018 | Burks | B64U 50/13 |
| 2019/0383052 | A1* | 12/2019 | Blake | B64U 80/40 |
| 2020/0001735 | A1* | 1/2020 | Cheng | G08G 5/76 |
| 2021/0031947 | A1* | 2/2021 | Wankewycz | B60L 53/36 |
| 2021/0047055 | A1* | 2/2021 | Lee | B64F 1/36 |
| 2021/0107682 | A1* | 4/2021 | Kozlenko | B64U 70/30 |
| 2021/0269174 | A1* | 9/2021 | Shuff | B60L 53/30 |
| 2021/0276735 | A1* | 9/2021 | Raptopoulos | A47G 29/141 |
| 2022/0396373 | A1* | 12/2022 | Wang | B60L 53/30 |
| 2024/0132238 | A1* | 4/2024 | Qiu | B64U 70/92 |
| 2024/0190593 | A1* | 6/2024 | Shah | B60L 53/14 |
| 2024/0239533 | A1* | 7/2024 | Li | B64U 70/99 |
| 2024/0268067 | A1* | 8/2024 | Fu | B64F 1/362 |

* cited by examiner

UNMANNED AERIAL VEHICLE BASE STATION AND UNMANNED AERIAL VEHICLE SYSTEM

CROSS REFERENCE TO RELATED DISCLOSURE

This patent claims priority of Chinese Patent Application No. 2023101066350.9, filed Feb. 3, 2023, the entirety of which is hereby incorporated herein by reference.

TECHNICAL FIELD

The embodiments of the present disclosure relate to the technical field of unmanned aerial vehicles, particularly to an unmanned aerial vehicle base station and an unmanned aerial vehicle system.

BACKGROUND

Unmanned aerial vehicles can be used to perform aerial photography, drug spraying, explorations, or like tasks because of their flexible operations. As one of the supporting facilities of unmanned aerial vehicles, an unmanned aerial vehicle base station is generally used to provide at least docking service, cleaning service, charging service, and like services for unmanned aerial vehicles when the unmanned aerial vehicle does not perform tasks.

In implementing the embodiments of the present disclosure, the inventors have found that: the existing heat dissipation systems of unmanned aerial vehicle base stations are single and simple, and most of the unmanned aerial vehicle base stations use fans directly to dissipate heat. When the unmanned aerial vehicle is docked at the unmanned aerial vehicle base station for charging, the temperatures of the unmanned aerial vehicle and the unmanned aerial vehicle base station are relatively high, and a simple heat dissipation system cannot effectively reduce the temperatures of the unmanned aerial vehicle and the base station, which reduces the charging efficiency of the unmanned aerial vehicle by the unmanned aerial vehicle base station.

SUMMARY

The technical problems to be mainly solved by the embodiments of the present disclosure are to provide an unmanned aerial vehicle base station and an unmanned aerial vehicle system that can perform heat dissipation on multiple areas of the unmanned aerial vehicle base station in a targeted manner, and effectively improve the working performance of the unmanned aerial vehicle base station.

The first aspect of the present disclosure is to provide an unmanned aerial vehicle base station, comprises a bracket, a tarmac, a charging component, and a temperature adjusting component. The bracket is provided with an accommodating cavity; the tarmac separates the accommodating cavity into an upper compartment chamber and a lower compartment chamber, the tarmac being configured to dock an unmanned aerial vehicle; the charging component is configured to provide electrical energy to an unmanned aerial vehicle docked at the tarmac; and a temperature adjusting component is provided in the lower compartment chamber, wherein the temperature adjusting component includes a semiconductor module, a first ventilation assembly, a second ventilation assembly, and a third ventilation assembly, and the semiconductor module is partially provided in the first ventilation assembly and partially provided in the second ventilation assembly; wherein the first ventilation assembly is configured to perform heat dissipation on the upper compartment chamber; the second ventilation assembly is configured to perform heat dissipation on part of the semiconductor module; and the third ventilation assembly is configured to perform heat dissipation on the lower compartment chamber.

The second aspect of this disclosure is to provide an unmanned aerial vehicle system, including an unmanned aerial vehicle and the unmanned aerial vehicle base station as described above.

An unmanned aerial vehicle base station in an embodiment of the present disclosure includes a bracket, a tarmac, a charging mechanism, and a temperature adjusting mechanism. The bracket includes an upper compartment cover and a lower compartment cover, and the tarmac is configured to dock an unmanned aerial vehicle. The temperature adjusting mechanism includes a semiconductor module, a first ventilation assembly, a second ventilation assembly, and a third ventilation assembly. An upper end of the semiconductor module is provided in the first ventilation assembly, and a lower end of the semiconductor module is provided in the second ventilation assembly; and components and parts such as the charging mechanism are provided in the third ventilation assembly.

BRIEF DESCRIPTION OF THE DRAWINGS

In order to state specific embodiments of the present disclosure or the technical solutions in the prior art more clearly, the following will briefly introduce the drawings needed in the description of specific embodiments and the prior art. Throughout the drawings, like elements or portions are generally identified by like reference numerals. In the drawings, elements or portions may not necessarily be drawn to scale.

DETAILED DESCRIPTION

Figure 1:
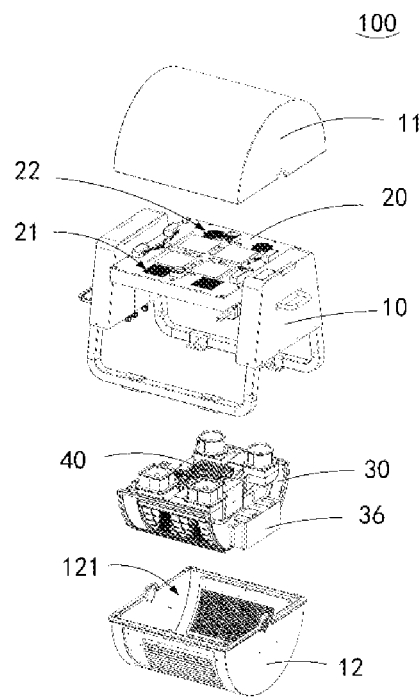
FIG. 1 is an exploded view of an unmanned aerial vehicle base station from one viewing angle according to an embodiment of the present disclosure.

In order to make the present disclosure readily understood, a more particular description of the disclosure will be rendered by reference to accompanying drawings and specific embodiments. It needs to be noted that when an element is referred to as being "secured" to another element, it can be directly on another element or one or more intervening elements may be present in between. When one element is referred to as being "connected" to another element, it can be directly connected to another element or one or more intervening elements may be present in between. As used in the description, the orientations or positional relationships indicated by the terms "up", "down", "inner", "outer", "vertical", "horizontal" and the like are based on the orientations or positional relationships shown in the drawings for purposes of describing the disclosure and simplifying the description only, and are not intended to indicate or imply that the referenced device or element must have a particular orientation or be constructed and operated in a particular orientation. It is therefore not to be understood as limiting the disclosure. Furthermore, the terms "first", "second", and the like are used for descriptive purposes only and are not to be construed as indicating or implying relative importance.

Unless defined otherwise, all technical and scientific terms used in the specification have the same meaning as commonly understood by one of ordinary skill in the art to which the present disclosure belongs. The terminology used in the description of the present disclosure is for the purpose of describing specific embodiments only and is not intended to limit the present disclosure. As used herein, the term "and/or" includes any and all combinations of one or more of the associated listed items.

Further, the technical features involved in different embodiments of the present disclosure described below can be combined with each other as long as they do not conflict with each other.

Figure 2:
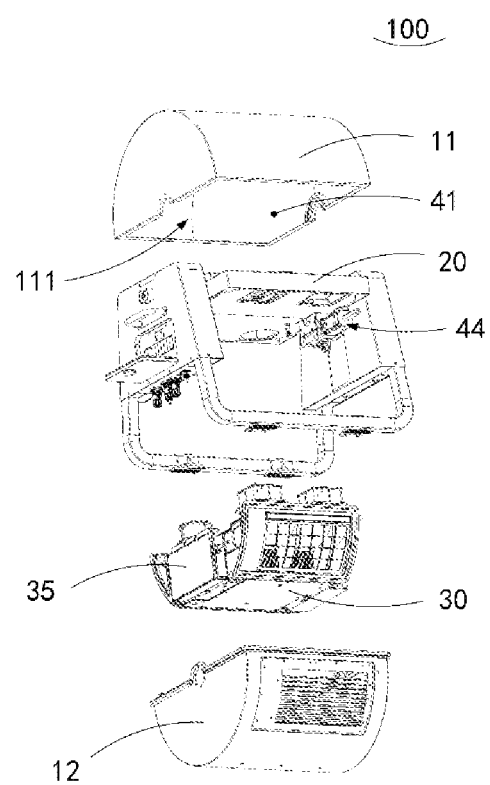
FIG. 2 is an exploded view of an unmanned aerial vehicle base station from another viewing angle according to an embodiment of the present disclosure.
Figure 3:
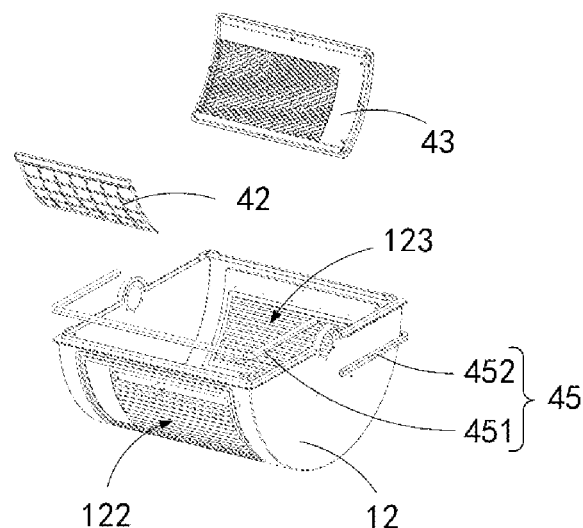
FIG. 3 is a schematic view of a lower compartment cover of an unmanned aerial vehicle base station according to an embodiment of the present disclosure.

Referring to FIGS. 1 to 3, an unmanned aerial vehicle base station 100 includes a bracket 10, a tarmac 20, a temperature adjusting component 30, and a charging component 40. The bracket 10 is provided with an accommodating cavity, the tarmac 20 is provided in the accommodating cavity, and the tarmac 20 is configured to the unmanned aerial vehicle to dock. The charging component 40 is provided in the accommodating cavity, and the charging component 40 is configured to supplying electric energy to the unmanned aerial vehicle docked on the tarmac 20. The temperature adjusting component 30 is provided in the accommodating cavity, and the temperature adjusting component 30 is configured to adjust the temperature in the accommodating cavity so that the temperature in the accommodating cavity is maintained within a temperature range suitable for charging an unmanned aerial vehicle, thereby ensuring the charging efficiency of the unmanned aerial vehicle by the unmanned aerial vehicle base station 100.

The bracket 10 comprises an upper compartment cover 11 and a lower compartment cover 12. When the upper compartment cover 11 and the lower compartment cover 12 are closed, a closed accommodating cavity is formed. Further, the upper compartment cover 11 is provided with an upper compartment chamber 111, the lower compartment cover 12 is provided with a lower compartment chamber 121, the tarmac 20 is provided on the lower compartment cover 12, the upper compartment chamber 111 is configured to accommodate the unmanned aerial vehicle, and the lower compartment chamber 121 is configured to accommodate the temperature adjusting component 30 and the charging component 40.

In some embodiments, the upper compartment cover 11 is arc-shaped towards the inner wall surface of the lower compartment cover 12. When the upper compartment cover 11 is closed on the lower compartment cover 12 to form a closed accommodating cavity, the inner wall surface of the arc-shaped structure of the upper compartment cover 11 is more conducive to the airflow stream formed when the temperature adjusting component 30 adjusts the temperature of the upper compartment chamber 111, effectively avoiding the phenomenon of airflow disturbance.

Referring to FIG. 2, the unmanned aerial vehicle base station 100 further comprises a first thermal insulation layer 41. The first thermal insulation layer 41 is provided on the inner wall surface of the upper compartment cover 11, and the first thermal insulation layer 41 is configured to reduce the heat exchange efficiency of the upper compartment chamber 111 with the outside. As an example, the first thermal insulation layer 41 may be an insulating cotton, a ceramic fiber layer, or the like.

Referring to FIG. 3, the lower compartment cover 12 is provided with a first ventilation opening 122 and a second ventilation opening 123 that communicate the lower compartment chamber 121 with the outside. Both the first ventilation opening 122 and the second ventilation opening 123 are configured to communicate with the temperature adjusting component 30 so that the temperature adjusting component 30 performs heat dissipation on the lower compartment chamber 121.

It could be understood that since the unmanned aerial vehicle base station 100 is generally mounted outdoors for use, in order to prevent external animals and sundries from entering the lower compartment chamber 121 which would otherwise affect the normal operation of the unmanned aerial vehicle base station 100, the unmanned aerial vehicle base station 100 further includes a first barrier net 42 and a second barrier net 43. The first barrier net 42 is detachably provided at the first ventilation opening 122, and the second barrier net 43 is detachably provided at the second ventilation opening 123.

In some embodiments, referring to FIG. 2, the unmanned aerial vehicle base station 100 also includes a drive assembly 44. The drive assembly 44 is provided to the bracket 10, the drive assembly 44 being configured to drive movement of the upper compartment cover 11 relative to the lower compartment cover 12 to effect opening or closing of the accommodating cavity by the upper compartment cover 11. The drive assembly 44 is connected to a controller to further enhance the intelligence of the unmanned aerial vehicle base station 100.

It could be appreciated that in order to reduce the space occupied by the upper compartment cover 11 after it is opened, the outer wall surface of the lower compartment cover 12 is arc-shaped, and at least part of the upper compartment cover 11 is nested with at least part of the lower compartment cover 12 when the drive assembly 44 drives the upper compartment cover 11 to open the upper compartment chamber 111.

Referring to FIG. 3, the unmanned aerial vehicle base station 100 further includes a first sealing assembly 45 in order to further improve the sealing property after the upper compartment cover 11 and the lower compartment cover 12 are closed. The first sealing assembly 45 for sealing the gap between the upper compartment cover 11 and the lower compartment cover 12 includes a first sealing member 451 and a second sealing member 452. The first sealing member 451 is provided on one side of a connecting end face of the lower compartment cover 12 facing the upper compartment cover 11, and the second sealing member 452 is provided on one side of a connecting end face of the lower compartment cover 12 facing away from the upper compartment cover 11. By the above arrangement, it is possible to reduce the gap after the upper compartment cover 11 and the lower compartment cover 12 are rotationally closed, effectively improving the air tightness of the upper compartment chamber 111.

With regard to the tarmac 20 described above, referring to FIG. 1, the tarmac 20 is provided with a first circulation air port 21 and a second circulation air port 22 penetrating through the tarmac 20 so as to make the upper compartment chamber 111 and the lower compartment chamber 121 in airflow communication. The first circulation air port 21 and the second circulation air port 22 both communicate with the temperature adjusting component 30, and the temperature adjusting component 30 located in the lower compartment chamber 121 performs airflow exchange with the upper compartment chamber 111 via the first circulation air port 21 and the second circulation air port 22, thereby adjusting the temperature in the upper compartment chamber 111.

It could be understood that, in other embodiments, the number of the first circulation air ports 21 is at least two, and at least two of the first circulation air ports 21 are provided in an array or randomly. The number of the second circulation air ports 22 is at least two, and at least two of the second circulation air ports 22 are provided in an array or randomly. The number of the first circulation air ports 21 is at least two, so that the aperture of each first circulation air port 21 is made small, and likewise, the number of the second circulation air ports 22 is at least two, so that the aperture of each second circulation air port 22 is made small, for example, 1 mm, 3 mm, 5 mm, etc. so as to effectively block sundries which enter the upper compartment chamber 111 from the outside from continuing to enter the lower compartment chamber 121, which would otherwise affect the normal adjustment operation of the temperature adjusting component 30.

Figure 4:
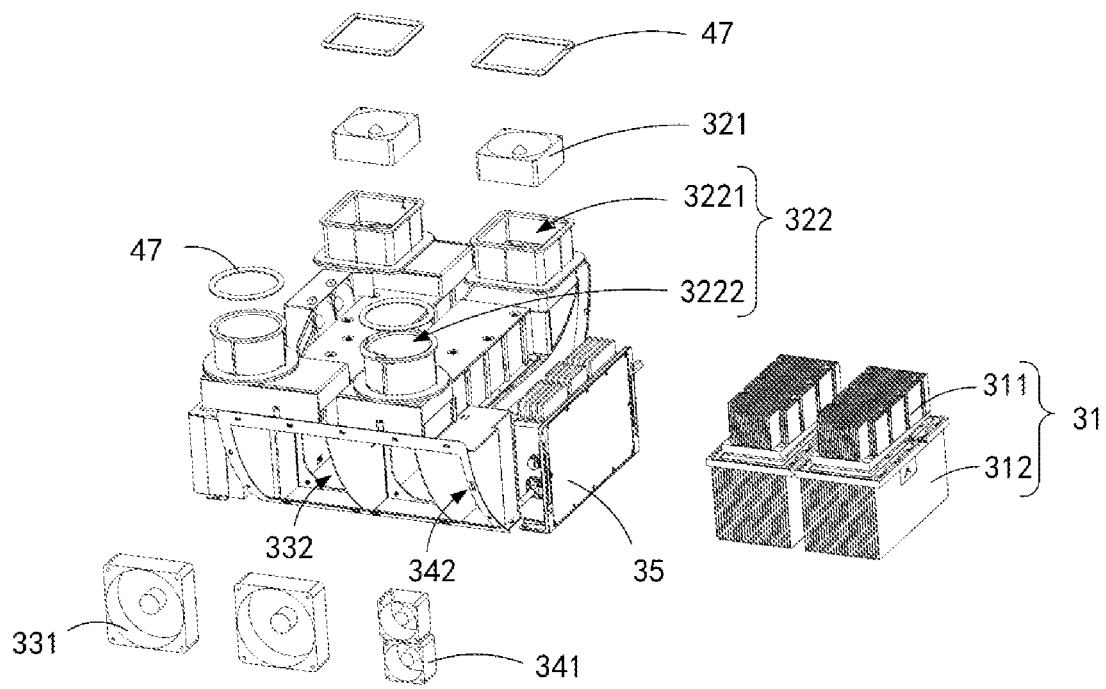
FIG. 4 is an exploded view of a temperature adjusting mechanism of an unmanned aerial vehicle base station from one viewing angle according to an embodiment of the present disclosure.

With regard to the temperature adjusting component 30 described above, referring to FIGS. 4 to 6, the temperature adjusting component 30 includes a semiconductor module 31, a first ventilation assembly, a second ventilation assembly, a third ventilation assembly, and an adapter 35. A part of the semiconductor module 31 is provided in the first ventilation assembly, and the first ventilation assembly cooperates with the part of the semiconductor module 31 located in the first ventilation assembly to adjust the temperature of the upper compartment chamber 111. A part of the semiconductor module 31 is provided in the second ventilation assembly, and the second ventilation assembly is used for performing heat dissipation on the part of the semiconductor module 31 located in the second ventilation assembly, so as to avoid the situation that the semiconductor module 31 works at such an excessively high temperature that it affects the working performance. The third ventilation assembly is in communication with the lower compartment chamber 121, and the third ventilation assembly is used for discharging the heat generated by components and parts such as the charging component 40 during operation to the outside in time, so as to avoid excessive temperature of the lower compartment chamber 121 caused by heat accumulation in the lower compartment chamber 121. The adapter 35 is provided in the lower compartment chamber 121, the adapter 35 is electrically connected to the semiconductor module 31, and the adapter 35 is configured to supply electric energy to the semiconductor module 31.

The first ventilation assembly includes a first fan 321 and a first air passage 322. The first air passage 322 is provided with a first opening 3221 and a second opening 3222 in communication with the upper compartment chamber 111, wherein the first opening 3221 is in airflow communication with the first circulation air port 21 of the tarmac 20, and the second opening 3222 is in airflow communication with the second circulation air port 22 of the tarmac 20; the upper end 311 of the semiconductor module 31 is located in the first air passage 322; and the upper end 311 of the semiconductor module 31 can heat or cool the gas in the first air passage 322. The first fan 321 is provided at the first opening 3221, and the first fan 321 is configured to provide airflow power so that a hot airflow or a cold airflow generated in the first air passage 322 is blown into the upper compartment chamber 111, thereby achieving temperature adjustment of the upper compartment chamber 111.

The unmanned aerial vehicle base station 100 further includes a second thermal insulation layer 46, and the second thermal insulation layer 46 is provided on the inner wall surface of the first air passage 322. Since the air heated or cooled by the upper end 311 of the semiconductor module 31 in the first air passage 322 is supplied into the upper compartment chamber 111 to adjust the temperature in the upper compartment chamber 111, providing the second thermal insulation layer 46 on the inner wall surface of the first air passage 322 can reduce the heat exchange between the hot air or cold air with the outside so as to improve the temperature adjustment efficiency of the upper compartment chamber 111, and the temperature of the upper compartment chamber 111 can be increased or decreased in a relatively short time. By way of example, the second thermal insulation layer 46 may be insulating cotton, a ceramic fiber layer, or the like.

The unmanned aerial vehicle base station 100 further includes a second sealing assembly 47, wherein the second sealing assembly 47 is provided between the tarmac 20 and the first ventilation assembly, and the second sealing assembly 47 is configured to seal the gap between the first opening 3221 of the first air passage 322 and the first circulation air port 21 of the tarmac 20, and seal the gap between the second opening 3222 of the first air passage 322 and the second circulation air port 22 of the tarmac 20, preventing the hot airflow or the cold airflow in the first air passage 322 from leaving the first air passage 322 from the gap, and reducing the temperature adjustment efficiency of the upper compartment chamber 111, and at the same time, avoiding the noise generated when the airflow in the first air passage 322 flows out from the gap, so as to improve the quality of the unmanned aerial vehicle base station 100.

Figure 5:
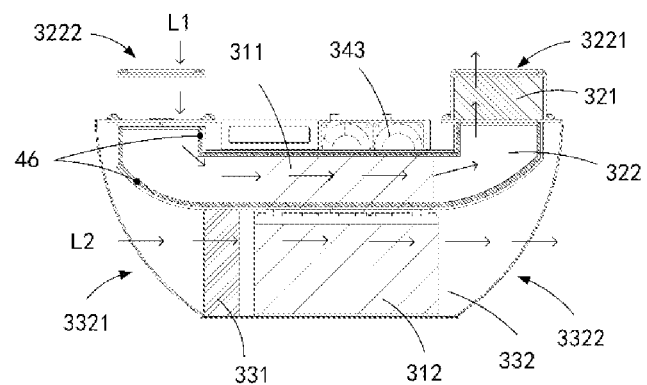
FIG. 5 is a sectional view of a temperature adjusting mechanism of an unmanned aerial vehicle base station from one viewing angle according to an embodiment of the present disclosure.

The second ventilation assembly includes a second fan 331 and a second air passage 332. The second air passage 332 is provided with a third opening 3321 and a fourth opening 3322, wherein the third opening 3321 is in airflow communication with the first ventilation opening 122 of the lower compartment cover 12, and the fourth opening 3322 is in airflow communication with the second ventilation opening 123 of the lower compartment cover 12; the lower end 312 of the semiconductor module 31 is located in the second air passage 332; when the upper end 311 of the semiconductor module 31 is in a cooling state, the lower end 312 of the semiconductor module 31 is in a heating state; and the second fan 331 is configured to discharge the heat generated by the lower end 312 of the semiconductor module 31 to the outside through the second air passage 332 in time. It could be understood that path L1 and path L2 formed by the arrows in FIG. 5 represent the airflow stream in the first air passage 322 and the second air passage 332, respectively. It is worth noting that the direction of the arrow does not limit the direction of the airflow stream.

The third ventilation assembly includes a third fan 341 and a third air passage 342. The third air passage 342 is provided with a fifth opening 3421 and a sixth opening 3422 communicating with the lower compartment chamber 121, wherein the fifth opening 3421 is in airflow communication with the first ventilation opening 122 of the lower compartment cover 12, and the sixth opening 3422 is in airflow communication with the first ventilation opening 122 of the lower compartment cover 12. Components and parts such as the charging component 40 and the adapter 35 are provided in the third air passage 342, and a third fan 341 is provided in the fifth opening 3421. The third fan 341 is configured to provide airflow power so as to discharge the heat generated by components and parts such as the charging component 40 and the adapter 35 in operation to the outside in time.

Figure 6:
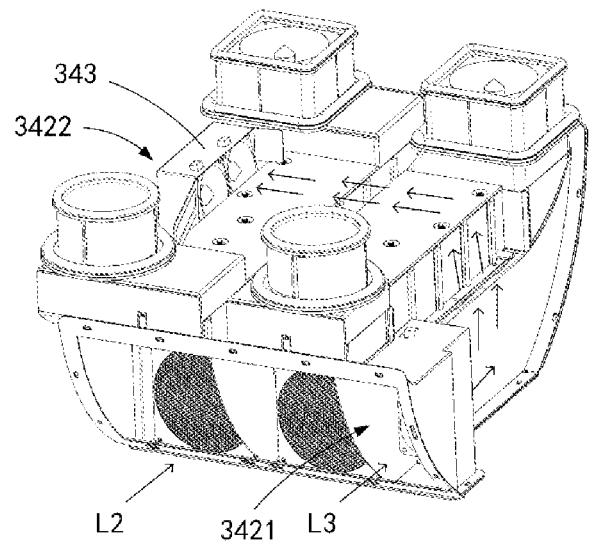
FIG. 6 is a schematic view of a temperature adjusting mechanism of an unmanned aerial vehicle base station from one viewing angle according to an embodiment of the present disclosure.

In other embodiments, the third ventilation assembly further includes a fourth fan 343 provided at the sixth opening 3422 in order to further improve the fluidity of the airflow in the lower compartment chamber 121 and enhance the heat dissipation effect. The third fan 341 and the fourth fan 343 cooperate together to perform heat dissipation on the components and parts in the lower compartment chamber 121 by means of blowing and sucking. As an example, the third fan 341 is used to suck relatively cold air from the outside into the lower compartment chamber 121, and relatively warm air after convective heat dissipation is performed on the components and parts such as the charging component 40 and the adapter 35 is blown to the outside by the fourth fan 343 to complete the blowing and sucking process. It could be understood that the path L3 formed by the arrows in FIG. 6 represents the airflow stream in the third air passage 342. It is worth noting that the direction of the arrow does not restrict the direction of the airflow stream.

Referring to FIG. 1, the temperature adjusting component 30 further includes a first backup battery 36. The first backup battery 36 is provided in the lower compartment chamber 121 and located in the third air passage 342, the first backup battery 36 is electrically connected to the adapter 35 and the semiconductor module 31, respectively, and the first backup battery 36 is configured to supply electric energy to the semiconductor module 31. It is worth noting that the direction of current when the adapter 35 directly supplies power to the semiconductor module 31 is opposite to the direction of current when the adapter 35 supplies power to the semiconductor module 31 through the first backup battery 36, so that the operating states of the upper end 311 and the lower end 312 of the semiconductor module 31 are reversed. As an example, when the adapter 35 directly supplies power to the semiconductor module 31, for example, the upper end 311 of the semiconductor module 31 is in a cooling state, and the lower end 312 of the semiconductor module 31 is in a heat dissipation state; and when the adapter 35 supplies power to the semiconductor module 31 through the first backup battery 36, the upper end 311 of the semiconductor module 31 is in a heat radiation state, and the lower end 312 of the semiconductor module 31 is in a cooling state.

In other embodiments, the temperature adjusting component 30 further includes a second backup battery. The second backup battery is respectively electrically connected to an external power source and the adapter 35, wherein the second backup battery is configured to store electric energy, so as to avoid the situation that the external power source cannot continuously supply power to the adapter 35, for example, in special cases of power cut, power failure, etc. Therefore, the second backup battery can continue to supply electric energy to the adapter 35.

An unmanned aerial vehicle base station 100 in an embodiment of the present disclosure includes a bracket 10, a tarmac 20, a charging component 40, a temperature adjusting component 30, and a first thermal insulation layer 41. The bracket 10 includes an upper compartment cover 11 and a lower compartment cover 12, and the tarmac 20 is configured to dock an unmanned aerial vehicle. The temperature adjusting component 30 includes a semiconductor module 31, a first ventilation assembly, a second ventilation assembly, and a third ventilation assembly. An upper end 311 of the semiconductor module 31 is provided in the first ventilation assembly, and a lower end 312 of the semiconductor module 31 is provided in the second ventilation assembly; and components and parts such as the charging component 40 are provided in the third ventilation assembly. With the above-mentioned structure, the ventilation and heat dissipation channels of the unmanned aerial vehicle base station 100 can have a clear division of labor, targeted heating and heat dissipation can be realized, and the working performance of each component and part can be effectively improved. In addition, providing the first thermal insulation layer 41 on the upper compartment cover 11 can effectively reduce the heat exchange efficiency between the upper compartment cover 11 and the outside, thereby realizing the scenario that the upper compartment cover 11 has the function of thermal insulation.

Figure 7:
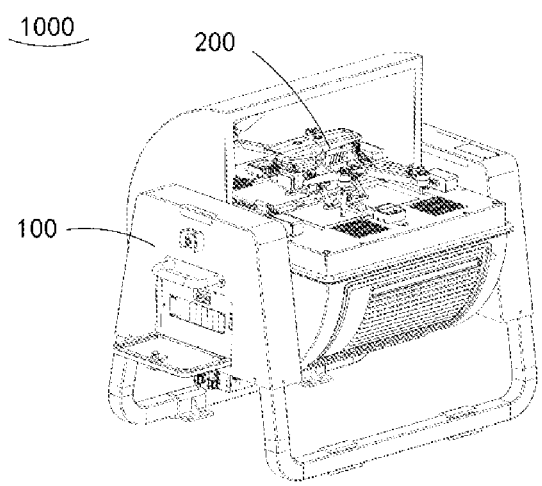
FIG. 7 is a schematic view of an unmanned aerial vehicle system from one viewing angle according to another embodiment of the present disclosure.

The present disclosure also provides an embodiment of an unmanned aerial vehicle system 1000. With reference to FIG. 7, the unmanned aerial vehicle system 1000 includes an unmanned aerial vehicle base station 100 and an unmanned aerial vehicle 200, wherein the unmanned aerial vehicle base station 100 at least provides docking and charging services for the unmanned aerial vehicle 200. The structure and function of the unmanned aerial vehicle base station 100 can be referred to the above embodiments, and will not be elaborated here.

Alternatively, the first ventilation assembly includes a first fan and a first air passage, the first air passage is provided with a first opening and a second opening communicating with the upper compartment chamber, the first fan is provided at the first opening, and an upper end of the semiconductor module is located in the first air passage.

Alternatively, the second ventilation assembly includes a second fan and a second air passage, the second air passage is provided with a third opening and a fourth opening communicating with an outside, the second fan is provided at the third opening, and a lower end of the semiconductor module is located in the second air passage.

Alternatively, the temperature adjusting component further includes an adapter, and the adapter is respectively electrically connected to the semiconductor module, the first fan, and the second fan; and when the semiconductor module supplies power through the adapter, the upper end of the semiconductor module is in a cooling state, and the lower end of the semiconductor module is in a heat dissipation state.

Alternatively, the temperature adjusting component further includes a first backup battery, and the first backup battery is respectively electrically connected to the adapter and the semiconductor module; and when the semiconductor module supplies power through the first backup battery, the upper end of the semiconductor module is in a heat dissipation state, and the lower end of the semiconductor module is in a cooling state.

Alternatively, the temperature adjusting component further includes a second backup battery electrically connected to the adapter, the second backup battery is configured to store electrical energy and provide electrical energy to the adapter.

Alternatively, the third ventilation assembly includes a third fan and a third air passage, the third air passage is in communication with the lower compartment chamber, the third air passage is provided with a fifth opening and a sixth opening in communication with the outside, and the third fan is provided at the fifth opening; and the third fan is configured to provide airflow power to perform heat dissipation on the charging component, the adapter, and the first backup battery located in the third air passage.

Alternatively, the third ventilation assembly further includes a fourth fan provided at the sixth opening, the third fan being configured to draw outside air into the third air passage, and the fourth fan being configured to blow air in the third air passage to the outside.

Alternatively, the bracket is provided with a first ventilation opening and a second ventilation opening, and the second ventilation assembly conducts air inflow from the first ventilation opening and air outflow from the second ventilation opening; and the third ventilation assembly conducts air inflow from the first ventilation opening and air outflow from the second ventilation opening; and the unmanned aerial vehicle base station further includes a first barrier net and a second barrier net, wherein the first barrier net is provided at the first ventilation opening, and the second barrier net is provided at the second ventilation opening.

The above-mentioned description is merely an embodiment of the present disclosure, and does not limit the scope of the present disclosure. Any equivalent structure or equivalent process change made by using the contents of the description and the drawings of the present disclosure or directly or indirectly used in other relevant technical fields is likewise included in the scope of protection of the present disclosure.

What is claimed is:

1. An unmanned aerial vehicle base station, comprising:
   a bracket provided with an accommodating cavity;
   a tarmac separating the accommodating cavity into an upper compartment chamber and a lower compartment chamber, the tarmac is configured to dock an unmanned aerial vehicle;
   a charging component configured to provide electrical energy to the unmanned aerial vehicle docked at the tarmac; and
   a temperature adjusting component provided in the lower compartment chamber, wherein the temperature adjusting component comprises a semiconductor module, a first ventilation assembly, a second ventilation assembly, and a third ventilation assembly, and the semiconductor module is partially provided in the first ventilation assembly and partially provided in the second ventilation assembly;
   wherein the first ventilation assembly is configured to perform heat dissipation on the upper compartment chamber; the second ventilation assembly is configured to perform heat dissipation on part of the semiconductor module; and the third ventilation assembly is configured to perform heat dissipation on the lower compartment chamber.

2. The unmanned aerial vehicle base station according to claim 1, wherein
   the first ventilation assembly comprises a first fan and a first air passage, the first air passage is provided with a first opening and a second opening communicating with the upper compartment chamber, the first fan is disposed at the first opening, and an upper end of the semiconductor module is disposed in the first air passage.

3. The unmanned aerial vehicle base station according to claim 2, wherein
   the second ventilation assembly comprises a second fan and a second air passage, the second air passage is provided with a third opening and a fourth opening communicating with an outside, the second fan is disposed at the third opening, and a lower end of the semiconductor module is disposed in the second air passage.

4. The unmanned aerial vehicle base station according to claim 3, wherein
   the temperature adjusting component further comprises an adapter, and the adapter is respectively electrically connected to the semiconductor module, the first fan, and the second fan; and
   when the semiconductor module supplies power through the adapter, the upper end of the semiconductor module is in a cooling state, and the lower end of the semiconductor module is in a heat dissipation state.

5. The unmanned aerial vehicle base station according to claim 4, wherein
   the temperature adjusting component further comprises a first backup battery, and the first backup battery is respectively electrically connected to the adapter and the semiconductor module; and
   when the semiconductor module supplies power through the first backup battery, the upper end of the semiconductor module is in the heat dissipation state, and the lower end of the semiconductor module is in the cooling state.

6. The unmanned aerial vehicle base station according to claim 4, wherein
   the temperature adjusting component further comprises a second backup battery electrically connected to the adapter, the second backup battery is configured to store electrical energy and provide electrical energy to the adapter.

7. The unmanned aerial vehicle base station according to claim 5, wherein
   the third ventilation assembly comprises a third fan and a third air passage, the third air passage is in communication with the lower compartment chamber, the third air passage is provided with a fifth opening and a sixth opening in communication with the outside, and the third fan is disposed at the fifth opening; and
   the third fan is configured to provide airflow power to perform heat dissipation on the charging component, the adapter, and the first backup battery located in the third air passage.

8. The unmanned aerial vehicle base station according to claim 7, wherein
   the third ventilation assembly further comprises a fourth fan provided at the sixth opening, the third fan being configured to draw outside air into the third air passage, and the fourth fan is configured to blow air in the third air passage to the outside.

9. The unmanned aerial vehicle base station according to claim 1, wherein
   the bracket is provided with a first ventilation opening and a second ventilation opening, and the second ventilation assembly conducts air inflow from the first ventilation opening and air outflow from the second ventilation opening; and the third ventilation assembly conducts air inflow from the first ventilation opening and air outflow from the second ventilation opening; and the unmanned aerial vehicle base station further comprises a first barrier net and a second barrier net, wherein the first barrier net is provided at the first ventilation opening, and the second barrier net is provided at the second ventilation opening.

10. The unmanned aerial vehicle base station according to claim 1, wherein the bracket further comprises a upper compartment cover and a lower compartment cover;

the unmanned aerial vehicle base station further comprises a first thermal insulation layer is positioned on a inner wall of the upper compartment cover, and the first thermal insulation layer is configured to reduce the efficiency of heat exchange between the upper compartment chamber and an external environment.

11. The unmanned aerial vehicle base station according to claim 10, wherein the unmanned aerial vehicle base station further comprises a first sealing component, and the first sealing component is configured to seal a first gap between the upper compartment cover and the lower compartment cover.

12. The unmanned aerial vehicle base station according to claim 11, wherein the first sealing component comprising a first sealing element and a second sealing element, the first sealing element is positioned on a connecting end of the lower compartment cover facing towards one side of the upper compartment cover, and the second sealing element is positioned on the connecting end of the lower compartment cover facing away from one side of the upper compartment cover.

13. The unmanned aerial vehicle base station according to claim 2, wherein the unmanned aerial vehicle base station further comprises a second thermal insulation layer, and the second thermal insulation layer is positioned on a inner wall of the first air passage.

14. The unmanned aerial vehicle base station according to claim 3, wherein the unmanned aerial vehicle base station further comprises a second sealing component, and the second sealing component is configured to seal a second gap between the first air passage and a first circulation vent and a second circulation vent.

15. The unmanned aerial vehicle base station according to claim 13, wherein the inner wall surface of the upper compartment cover facing towards the lower compartment cover being curved.

16. The unmanned aerial vehicle base station according to claim 10, wherein the unmanned aerial vehicle base station further comprises comprising a driving component, and the driving component is positioned on the bracket, the driving component is configured to drive the rotation of the upper compartment cover to open or close the upper compartment chamber.

17. An unmanned aerial vehicle system, comprising an unmanned aerial vehicle and an unmanned aerial vehicle base station, the unmanned aerial vehicle base station is configured to dock the unmanned aerial vehicle, wherein the unmanned aerial vehicle base station comprises:

a bracket provided with an accommodating cavity;

a tarmac separating the accommodating cavity into an upper compartment chamber and a lower compartment chamber, the tarmac is configured to dock an unmanned aerial vehicle;

a charging component configured to provide electrical energy to the unmanned aerial vehicle docked at the tarmac; and a temperature adjusting component provided in the lower compartment chamber, wherein the temperature adjusting component comprises a semiconductor module, a first ventilation assembly, a second ventilation assembly, and a third ventilation assembly, and the semiconductor module is partially provided in the first ventilation assembly and partially provided in the second ventilation assembly;

wherein the first ventilation assembly is configured to perform heat dissipation on the upper compartment chamber; the second ventilation assembly is configured to perform heat dissipation on part of the semiconductor module; and the third ventilation assembly is configured to perform heat dissipation on the lower compartment chamber.

18. The unmanned aerial vehicle system according to claim 17, wherein the bracket further comprises a upper compartment cover and a lower compartment cover;

the unmanned aerial vehicle base station further comprises a first thermal insulation layer is positioned on a inner wall of the upper compartment cover, and the first thermal insulation layer is configured to reduce the efficiency of heat exchange between the upper compartment chamber and an external environment.

19. The unmanned aerial vehicle system according to claim 18, wherein wherein the unmanned aerial vehicle base station further comprises comprising a driving component, and the driving component is positioned on the bracket, the driving component is configured to drive the rotation of the upper compartment cover to open or close the upper compartment chamber.

* * * * *